(12) United States Patent
Nie et al.

(10) Patent No.: US 9,471,177 B2
(45) Date of Patent: Oct. 18, 2016

(54) DRIVE CIRCUIT AND DRIVE METHOD, SHIFT REGISTER, PIXEL UNIT AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan Province (CN)

(72) Inventors: Leisen Nie, Beijing (CN); Xiaojing Qi, Beijing (CN)

(73) Assignees: BOE Technology Group Co., Ltd. (CN); Chengdu BOE Optoelectronics Technology Co., Ltd. (CN)

( * ) Notice: Subject to any disclaimer, the term of this patent is extended or adjusted under 35 U.S.C. 154(b) by 356 days.

(21) Appl. No.: 14/361,470

(22) PCT Filed: Nov. 21, 2013

(86) PCT No.: PCT/CN2013/087557
§ 371 (c)(1),
(2) Date: May 29, 2014

(87) PCT Pub. No.: WO2015/027584
PCT Pub. Date: Mar. 5, 2015

(65) Prior Publication Data
US 2016/0224183 A1 Aug. 4, 2016

(30) Foreign Application Priority Data
Aug. 30, 2013 (CN) .......................... 2013 1 0390801

(51) Int. Cl.
G06F 3/041 (2006.01)
H01L 27/32 (2006.01)
G09G 3/32 (2016.01)

(52) U.S. Cl.
CPC ........... *G06F 3/0418* (2013.01); *G06F 3/0412* (2013.01); *G09G 3/3258* (2013.01); *G09G 3/3266* (2013.01); *G09G 3/3275* (2013.01); *H01L 27/323* (2013.01); *G09G 2300/0426* (2013.01); *G09G 2310/0286* (2013.01); *G09G2320/0209* (2013.01); *G09G 2320/0626* (2013.01)

(58) Field of Classification Search
CPC combination set(s) only.
See application file for complete search history.

(56) References Cited

FOREIGN PATENT DOCUMENTS

| CN | 102982846 A | 3/2013 |
|---|---|---|
| CN | 103135846 A | 6/2013 |
| CN | 203520831 U | 4/2014 |
| KR | 20090009387 A | 1/2009 |
| TW | 200635351 A | 10/2006 |

OTHER PUBLICATIONS

Text of the Notification of the First Office Action, App. No. 2013103908019, Jan. 6, 2015.
Written Opinion in International Application No. PCT/CN2013/087557, dated May 8, 2014.

*Primary Examiner* — Van Chow
(74) *Attorney, Agent, or Firm* — Bakerhostetler LLP (57) ABSTRACT

The invention is directed to a drive circuit, drive method and a shift register for a display device with touch control function. The drive circuit includes a driving and amplifying module, a touch screen driving module and a time-sharing drive control module. The time-sharing drive control module is adapted to send a time-sharing drive control signal according to a first control signal and a second control signal. The driving and amplifying module is adapted to drive the OLED during an OLED drive phase according to the time-sharing drive control signal, amplify a touch sensor output signal during a touch screen drive phase and control the touch screen driver module to drive the touch screen according to a touch control signal and the amplified touch sensor output signal.

9 Claims, 4 Drawing Sheets

| When the first control signal and the second control signal are in a first level simultaneously, the time-sharing drive control module controls the driving and amplifying module to amplify the touch sensor output signal, and controls the OLED to be in a reversely biased state; and when the touch control signal is in the first level, a touch screen drive signal is output by the touch screen driving module according to the amplified touch sensor output signal to drive the touch screen. | 41 |
|---|---|
| When the first control signal and the second control signal are in a second level, the OLED is driven by the driving and amplifying module during a clock cycle following a clock cycle during which the first level is output on the scan line and the data line simultaneously. | 42 |

DRIVE CIRCUIT AND DRIVE METHOD, SHIFT REGISTER, PIXEL UNIT AND DISPLAY DEVICE

CROSS-REFERENCE TO RELATED APPLICATION

This application is the U.S. national phase of PCT Application No. PCT/CN2013/087557 filed on Nov. 21, 2013, which claims priority to Chinese Patent Application No. 201310390801.9 filed on Aug. 30, 2013, the disclosures of which are incorporated in their entirety by reference herein.

TECHNICAL FIELD

The present disclosure relates to the technical field of OLED touch screen drive technology, and in particular to a drive circuit, a drive method, a shift register, a pixel unit and a display device.

BACKGROUND

With rapid development of display technology, a display device with touch control function is becoming more and more popular due to its advantages such as visualization operation. The existing display device with touch control function can be generally classified as an on-cell touch panel and an in-cell touch panel according to a relative position between a touch panel and a display panel. As compared with the on-cell touch panel, the in-cell touch panel has less thickness and higher light transmittance.

In the existing OLED display panel, each OLED achieves display by driving to emit light using an OLED drive circuit including a plurality of Thin Film Transistors (TFT) switches within one pixel unit on the array substrate. For the in-cell touch panel, a touch sensor and a touch screen drive circuit are manufactured in each pixel unit on the array substrate by using the array process similarly. If the touch sensor and the touch screen drive circuit are directly superposed into the OLED pixel, a certain number of touch screen drive circuits TFT are add necessarily, thus it is needed to occupy a certain space of the pixel unit, and since the OLED and the touch screen are driven by a single drive circuit, crosstalk between an OLED drive signal and a touch screen drive signal may be caused easily.

SUMMARY

A main object of the disclosure is to provide a drive circuit and a drive method, a shift register, a pixel unit and a display device, for driving an OLED and a touch screen in a time-sharing manner, so as to drive the OLED and the touch screen using less elements and avoid crosstalk between an OLED drive signal and a touch screen drive signal effectively.

To achieve the above objects, it is provided a drive circuit for driving an OLED and a touch screen in an embedded OLED touch screen in a time-sharing manner, the drive circuit including a driving and amplifying module, a touch screen driving module and a time-sharing drive control module, wherein the time-sharing drive control module is coupled respectively to a touch sensor signal output terminal, the driving and amplifying module, a first control signal output terminal, a second control signal output terminal and a first voltage terminal, and is configured to send a time-sharing drive control signal according to a first control signal and a second control signal;

the touch screen driving module is coupled respectively to the driving and amplifying module and a touch control signal output terminal, and is coupled to the touch screen via a touch screen drive signal output terminal; and the driving and amplifying module is coupled respectively to the OLED, a second voltage terminal, a data line and a scan line, and is configured to drive the OLED during an OLED drive phase according to the time-sharing drive control signal, amplify a touch sensor output signal during a touch screen drive phase, and control the touch screen driving module to drive the touch screen according to a touch control signal and the amplified touch sensor output signal.

In implementation, the driving and amplifying module may include a drive transistor, an input transistor and a storage capacitor, wherein the drive transistor has a gate electrode coupled to the touch sensor signal output terminal via the time-sharing drive control module, a first electrode coupled respectively to the first voltage terminal and the touch screen driving module, and a second electrode coupled respectively to the second voltage terminal and an anode of the OLED via the time-sharing drive control module;

the input transistor has a gate electrode coupled to the scan line, a first electrode coupled to the data line, and a second electrode coupled to the gate electrode of the drive transistor; and the storage capacitor has a first terminal coupled to the gate electrode of the drive transistor and a second terminal coupled to the second electrode of the drive transistor.

In implementation, the time-sharing drive control module may include a first control transistor and a second control transistor, wherein the first control transistor has a gate electrode coupled to the first control signal output terminal, a first electrode coupled to the second electrode of the drive transistor, and a second electrode coupled to the second voltage terminal; and the second control transistor has a gate electrode coupled to the second control signal output terminal, a first electrode coupled to the gate electrode of the drive transistor, and a second electrode coupled to the touch sensor signal output terminal.

In implementation, the touch screen driving module may include a touch screen drive transistor, which has a gate electrode coupled to the touch control signal output terminal, a first electrode coupled to the first voltage terminal and a second electrode which is the touch screen drive signal output terminal.

It is further provided a drive method adapted to the above drive circuit in the disclosure, the method including a touch screen drive step and an OLED drive step, wherein, in the touch screen drive step, when the first control signal and the second control signal are in a first level simultaneously, the time-sharing drive control module controls the driving and amplifying module to amplify the touch sensor output signal, and controls the OLED to be in a reversely biased state; and when the touch control signal is in the first level, a touch screen drive signal is output by the touch screen driving module according to the amplified touch sensor output signal to drive the touch screen; and in the OLED drive step, when the first control signal and the second control signal are in a second level, the OLED is driven by the driving and amplifying module during a clock cycle following a clock cycle during which the first level is output on the scan line and the data line simultaneously.

It is further provided a drive method adapted to the above drive circuit in the disclosure, the method including a touch screen drive step and an OLED drive step, wherein, in the touch screen drive step, when the first control signal and the second control signal are in a first level simultaneously, the touch sensor output signal is controlled by the time-sharing drive control module to be input into the gate electrode of the drive transistor, the OLED is controlled by the time-sharing drive control module to be in a reversely biased state, and the touch sensor output signal is amplified by the drive transistor; and when the touch control signal is in the first level, a touch screen drive signal is output by the touch screen drive transistor according to the amplified touch sensor output signal to drive the touch screen; and in the OLED drive step, when the first control signal and the second control signal are in a second level, the OLED is driven by the drive transistor during a clock cycle following a clock cycle during which the first level is output on the scan line and the data line simultaneously.

In implementation, the touch screen drive step may include:

a pre-charging step in which the first level is output at the first voltage terminal, on the data line and on the scan line, the first control signal and the second control signal are in the first level, the touch control signal is in the second level, the drive transistor and the input transistor are on, the touch screen drive transistor is off, the OLED is in the reversely biased state, the data signal output on the data line and the touch sensor output signal are input into the gate electrode of the drive transistor, and the storage capacitor is charged;

a discharging step in which the first level is output at the first voltage terminal and on the scan line, the first control signal and the second control signal are in the first level, the second level is output on the data line, the touch control signal is in the second level, the OLED drive transistor is lightly conducting the input transistor is on, the touch screen drive transistor is off, the OLED is in the reversely biased state, the touch sensor output signal is input into the gate electrode of the drive transistor, and the storage capacitor is discharged;

a touch control step in which the first level is output at the first voltage terminal, the first control signal and the second control signal are in the first level, the second level is output on the scan line and the data line, the touch control signal is in the second level, the input transistor is off, the touch screen drive transistor is off, the OLED is in the reversely biased state, the level of the gate electrode of the drive transistor is pulled down by the touch sensor output signal via the time-sharing drive control module, and the touch sensor output signal is amplified by the drive transistor; and a touch screen drive step in which the first level is output at the first voltage terminal, the first control signal, the second control signal and the touch control signal are in the first level, the second level is output on the scan line and the data line, the input transistor is off, the OLED is in the reversely biased state, the touch screen drive transistor is on, and the touch screen drive signal is sent by the touch screen drive transistor according to the amplified touch sensor output signal to drive the touch screen.

In implementation, the OLED drive step may include:

a pixel charging step in which the second level is output at the first voltage terminal and on the data line, the second control signal and the touch control signal are in the second level, the first control signal is in the first level, the first level is output on the scan line, the drain electrode of the drive transistor is in a open state, the gate electrode of the drive transistor is set to be in a low level, the OLED is in the reversely biased state, and the storage capacitor is charged;

a pixel discharging step in which the first level is output at the first voltage terminal, the second level is output on the data line, the second control signal and the touch control signal are in the second level, the first control signal is in the second level, the first level is output on the scan line, the drive transistor is on, and the storage capacitor is discharged;

a data inputting step in which the second level is output at the first voltage terminal, the first control signal and the second control signal are in the second level, the first level is output on the scan line and the data line, the touch control signal is in the second level, the drain electrode of the drive transistor is in a open state, the first level output on the data line is input into the storage capacitor, and the level of the source electrode of the drive transistor is pulled up; and an OLED light emitting step in which the first level is output at the first voltage terminal, the first control signal and the second control signal are in the second level, the second level is output on the scan line and the data line, the touch control signal is in the second level, and the drive transistor is on, for controlling the OLED to emit light.

It is further provided a shift register including N stages of drive circuits described above, wherein the touch screen drive signal output terminal of the $(M-1)^{th}$ stage of drive circuit is coupled to the touch control signal output terminal of the $M^{th}$ stage of drive circuit, where M is a positive integer greater than 2 and less than or equal to N, and N is a positive integer greater than 2.

It is further provided a pixel unit including an OLED and the above drive circuit, wherein the drive circuit is coupled to the anode of the OLED, and the cathode of the OLED is coupled to the second voltage terminal.

It is further provided a display device including a plurality of pixel units described above.

As compared with the prior art, with the drive circuit and the drive method, the shift register, the pixel and the display device described in the disclosure, the driving and amplifying module and the touch screen driver module are controlled by the time-sharing drive control module to drive the OLED and the touch screen in a time-sharing manner, the OLED and the touch screen are driven in the time-sharing manner by adjusting the time sequence of the signal without adding a drive signal, thus the OLED and the touch screen are driven with less elements and the crosstalk between the OLED drive signal and the touch screen drive signal is avoided efficiently.

DETAILED DESCRIPTION

Hereinafter, technical solutions in the embodiments of the disclosure will be described clearly and completely in conjunction with the drawings in the embodiments of the disclosure. Apparently, the described embodiments are only a part of the embodiments of the disclosure, but not all. All other embodiments made by those skilled in the art based on the embodiments of the disclosure without creative work fall within the scope of protection of the disclosure.

Transistors adopted in each embodiment of the disclosure may be a thin-film transistor, a field effect transistor or other elements with the same characteristics. In an embodiment of the disclosure, to distinguish between two electrodes other than the gate electrode of the transistor, one of the two electrodes is referred to as the source electrode, and the other one is referred to as the drain electrode. Further, the transistors can be classified into N-type transistor and P-type transistor according to the characteristic of the transistor. In a drive circuit provided in an embodiment of the disclosure, all the transistors are described by taking the N-type transistor as an example, and the implementation using the P-type transistor is conceivable by those skilled in the art without creative work and thus falls within the scope of protection of the embodiment of the disclosure.

Figure 1:
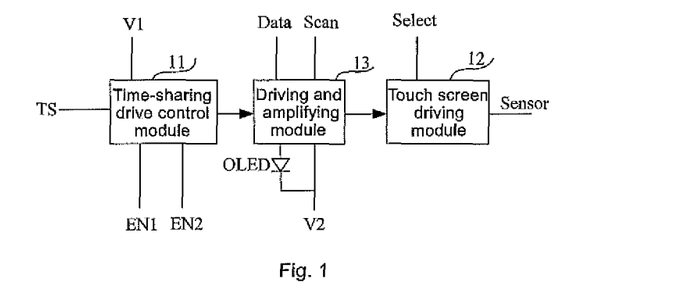
FIG. 1 is a structural diagram of a drive circuit according to a first embodiment of the present invention.

As shown in FIG. 1, a drive circuit according to the first embodiment of the disclosure is adapted to drive an OLED and a touch screen in an embedded OLED touch screen in a time-sharing manner, the drive circuit includes a time-sharing driving control module 11, a touch screen driving module 12 and a driving and amplifying module 13.

The time-sharing drive control module 11 is coupled respectively to a touch sensor signal output terminal TS, the driving and amplifying module 13, a first control signal output terminal EN1, a second control signal output terminal EN2 and a first voltage terminal V1, and is configured to send a time-sharing drive control signal according to a first control signal and a second control signal.

The touch screen driver module 12 is coupled respectively to the driving and amplifying module 13 and a touch control signal output terminal Select, and is coupled to the touch screen via a touch screen drive signal output terminal Sensor (only Sensor is shown in FIG. 1 and the connection between Sensor and the touch screen is not shown).

The driving and amplifying module 13 is coupled respectively to the OLED, a second voltage terminal V2, a data line Data and a scan line Scan, and is configured to drive the OLED during an OLED drive phase according to the time-sharing drive control signal, amplify a touch sensor output signal during a touch screen drive phase, and control the touch screen driving module 12 to drive the touch screen according to a touch control signal and the amplified touch sensor output signal.

In the drive circuit according to a first embodiment of the disclosure, the driving and amplifying module 13 and the touch screen driving module 12 are controlled by the time-sharing drive control module 11 to drive the OLED and the touch screen in a time-sharing manner. In this way, the OLED and the touch screen are driven in the time-sharing manner by adjusting time sequence of the signal without adding a drive signal, thus the OLED and the touch screen are driven with less elements, and at the same time, the crosstalk between the OLED drive signal and the touch screen drive signal is avoided efficiently.

In the drive circuit provided in the embodiment of the disclosure, all the transistors are described by taking the N-type transistor as an example, in which a first electrode of the N-type transistor may be the source electrode, and a second electrode of the N-type transistor may be the drain electrode. The implementation using the P-type transistor is conceivable by those skilled in the art without creative work and thus falls within the scope of protection of the embodiment of the disclosure.

A second embodiment of the drive circuit according to the disclosure is based on the first embodiment of the drive circuit according to the disclosure.

Figure 2:
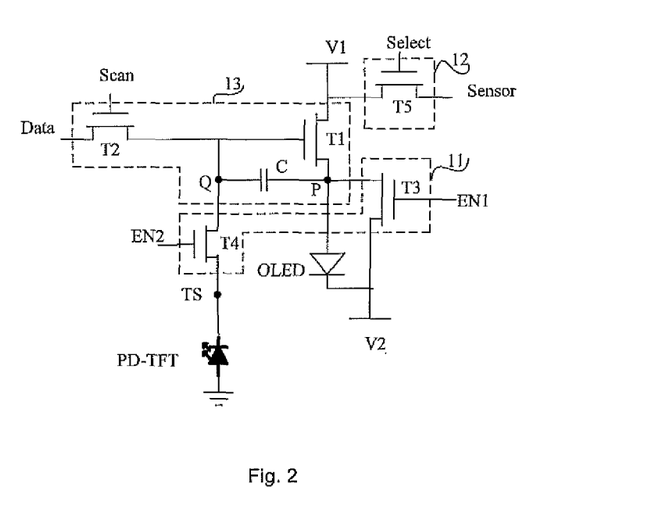
FIG. 2 is a circuit diagram of a drive circuit according to a second embodiment of the present invention.

As shown in FIG. 2, in the second embodiment of the drive circuit according to the disclosure, the driving and amplifying module includes a drive transistor T1, an input transistor T2 and a storage capacitor C.

The drive transistor T1 has a gate electrode coupled to the touch sensor signal output terminal TS via the time-sharing drive control module 11, a first electrode coupled respectively to the first voltage terminal V1 and the touch screen driving module 12, and a second electrode coupled respectively to the second voltage terminal V2 and an anode of the OLED via the time-sharing drive control module 11.

The input transistor T2 has a gate electrode coupled to the scan line Scan, a first electrode coupled to the data line Data, and a second electrode coupled to the gate electrode of the drive transistor T1.

The storage capacitor C has a first terminal coupled to the gate electrode of the drive transistor T1 and a second terminal coupled to the second electrode of the drive transistor T.

In implementation, as shown in FIG. 2, the touch sensor is a photoelectric sensor PD-TFT, one terminal of which is the touch sensor signal output terminal TS. In the embodiment as shown in FIG. 2, the level VDD is input into the first voltage terminal V1, and the reference level Vref is input into the second voltage terminal.

As shown in FIG. 2, in the second embodiment of the drive circuit according to the disclosure, the time-sharing drive control module 11 includes a first control transistor T3 and a second control transistor T4.

The first control transistor T3 has a gate electrode coupled to the first control signal output terminal EN1, a first electrode coupled to the second electrode of the drive transistor T1, and a second electrode coupled to the second voltage terminal V2.

The second control transistor T4 has a gate electrode coupled to the second control signal output terminal EN2, a first electrode coupled to the gate electrode of the drive transistor T1, and a second electrode coupled to the touch sensor signal output terminal TS.

As shown in FIG. 2, in the second embodiment of the drive circuit according to the disclosure, the driving and amplifying module 13 includes a touch screen drive transistor T5, which has a gate electrode coupled to the touch control signal output terminal Select, a first electrode coupled to the first voltage terminal V1 and a second electrode which is coupled to the touch screen and which is the touch screen drive signal output terminal Sensor.

In FIG. 2, point P is an endpoint coupled to the second electrode of T1, and point Q is an endpoint coupled to the gate electrode of T1.

In the drive circuit as shown in FIG. 2, each of the transistors may be N-type transistor, and may also be P-type transistor. In the embodiment of the disclosure, the transistors are described by taking the N-type transistor as an example, and it can be conceived that if the transistors are the P-type transistor, the same function can also be achieved by only adjusting the high and low level of the time sequence control signal.

Figure 3:
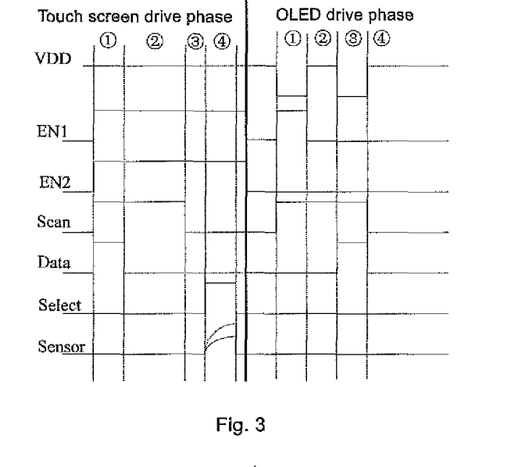
FIG. 3 is a signal sequence diagram the drive circuit in work according to the second embodiment of the present invention.

As shown in FIG. 3, the work of the drive circuit according to the second embodiment of the disclosure is divided into two phases, a touch screen drive phase and an OLED drive phase.

As shown in FIG. 3, the touch screen drive phase is divided into the following four phases.

In a first phase, the first voltage terminal V1, the first control signal output terminal EN1, the second control signal output terminal EN2, the scan line Scan and the data line Data output a high level, the touch control signal output terminal Select outputs a low level, the storage capacitor C starts to be charged, the level of the gate electrode of T1 is high, VDD is grounded via T1 and T3, T5 is off, and T2 and T4 are on, for achieving the initialization of the circuit.

In a second phase, the first voltage terminal V1, the first control signal output terminal EN1, the second control signal output terminal EN2 and the scan line Scan output a high level, the data line Data and the touch control signal output terminal Select output a low level, the storage capacitor C starts to be discharged, T1 is lightly conducting, T5 is off, T3 is on, and T2 and T4 are on.

In a third phase, the first voltage terminal V1, the first control signal output terminal EN1 and the second control signal output terminal EN2 output a high level, the scan line Scan, the data line Data and the touch control signal output terminal Select output a low level, and the voltage across the storage capacitor C is completely loaded on the gate electrode of T1.

In a touch state and a non-touch state, the on/off states of T1 are different, and thus the amplitudes of the current flowing through T1 are different.

T5 is off, T3 is on, T4 is on, and T2 is off.

In the touch state, the current output from PD-TFT is higher, and then the level of the gate electrode of T1 can be pulled down directly by T4.

In the non-touch state, the current output from PD-TFT is lower, and as compared with the touch state, the amplitude by which the level of the gate electrode of T1 is pulled down is less.

In the touch state, PD-TFT is on, the voltage of the gate electrode of the drive transistor is pulled down significantly, and then the drive transistor is in the lightly conducting state when the voltage of the gate electrode is in the high level. In the non-touch state, PD-TFT is off, the level of point P is kept well, and the drive transistor is completely on when the voltage of the gate electrode is in the high level.

In the touch screen drive phase, the current flowing through T1 and the signal output from the touch screen drive signal output terminal Sensor are consistent.

In a fourth phase, the first voltage terminal V1, the first control signal output terminal EN1, the second control signal output terminal EN2 and the touch control signal output terminal Select output a high level, the scan line Scan and the data line Data output a low level, T5 is on, T3 is on, T4 is on, and T2 is off. Then, in the touch state and the non-touch state, the levels of the gate electrode of T1 are different, the voltages output from the touch screen drive signal output terminal Sensor are different, the signals output from the touch screen drive signal output terminal Sensor are different due to the amplification of T5, so that the touch screen is driven to work. As shown in FIG. 3, the schematic diagram of the signal in the touch state is shown by the solid line of the fourth phase, and the schematic diagram of the signal in the non-touch state is shown by the dashed line of the fourth phase.

As shown in FIG. 3, the OLED drive phase is divided into the following four phases.

Figure 3A:
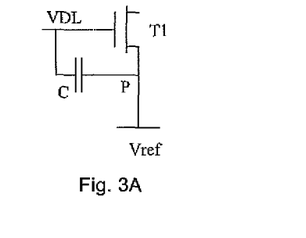
FIG. 3A, FIG. 3B, FIG. 3C and FIG. 3D are equivalent circuit diagrams of four stages of the drive circuit during an OLED drive phase according to the second embodiment of the present invention respectively.

In a first phase, the first voltage terminal V1, the second control signal output terminal EN2, the data line Data and the touch control signal output terminal Select output a low level, the first control signal output terminal EN1 and the scan line Scan output a high level, the drain electrode of T1 is in a open state, the gate electrode of T1 is input a low level, T5 is off, T3 is on, T4 is off, T2 is on, two terminals of OLED are reversly biased, the storage capacitor C is charged, the voltage across the storage capacitor C is Vc=VDL−Vref, and VDL is the low level value output from the data line Data.

Figure 3B:
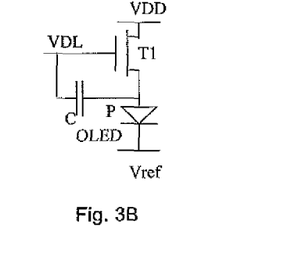

In a second phase, the first voltage terminal V1 and the scan line Scan output a high level, the first control signal output terminal EN1, the second control signal output terminal EN2, the data line Data and the touch control signal output terminal Select output a low level, T5 is off, T3 is off, T4 is off, T2 is on, T1 is on, and the level of point P is pulled up to VQ−Vth (where VQ is the level of the point Q, and Vth is the threshold voltage of T1).

Figure 3C:
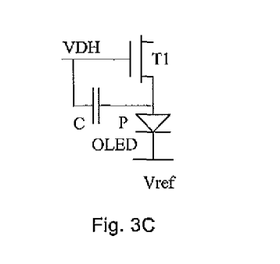

In a third phase, the first voltage terminal V1, the first control signal output terminal EN1, the second control signal output terminal EN2 and the touch control signal output terminal Select output a low level, the data line Data and the scan line Scan output a high level, T5 is off, T3 is off, T4 is off, the drain electrode of T1 is in a open state, the level of the point Q is pulled up to VDH, the level of the point P also starts to be pulled up to Vp', and considering the co-operation of the storage capacitor C and the OLED's own capacitor Coled, it results that $$Vp' = (VDH - Vref) \times \frac{Coled}{Coled + C} + Vth - Vref,$$

where VDH is the high level value output from the data line Data.

Figure 3D:
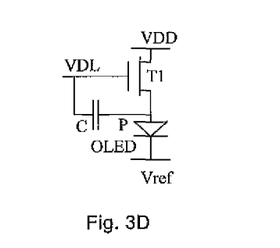

In a fourth phase, the first voltage terminal V1 outputs a high level, the first control signal output terminal EN1, the second control signal output terminal EN2, the touch control signal output terminal Select, the data line Data and the scan line Scan output a low level, T5 is off, T3 is off, T4 is off, T2 is off, and the OLED starts to emit light, I=

$$K \times (Vgs - Vth)^2 = K \times (VDL - Vp - Vth)^2 =$$
$$K \times \left(VDL - \frac{Coled}{Coled + C} \times VDH - \frac{C}{Coled + C} \times Vref\right)^2;$$

where Vp is the voltage value of the point P in this time, and I is the current flowing through OLED; and in this process, Vref<<VDL.

With this, the current flowing through the OLED is consist but not affected by the threshold voltage Vth of T1, and the evenness of the lightness of the OLED can be achieved by improving the evenness of the current flowing through the OLED.

FIG. 3A, FIG. 3B, FIG. 3C and FIG. 3D are respectively equivalent circuit diagrams of four phases of the drive circuit according to the second embodiment of the disclosure during the OLED drive phase.

It is further provided a shift register including N stages of drive circuits described above, wherein the touch screen drive signal output terminal of the $(M-1)^{th}$ stage of drive circuit is coupled to the touch control signal output terminal of the $M^{th}$ stage of drive circuit, where M is a positive integer greater than 2 and less than or equal to N, and N is a positive integer greater than 2.

In the shift register according to the embodiment of the disclosure, by using the touch screen drive signal of the previous stage of drive circuit as the touch control signal of the next stage of drive circuit, the crosstalk between the touch screen drive signals can be avoided effectively.

Figure 4:
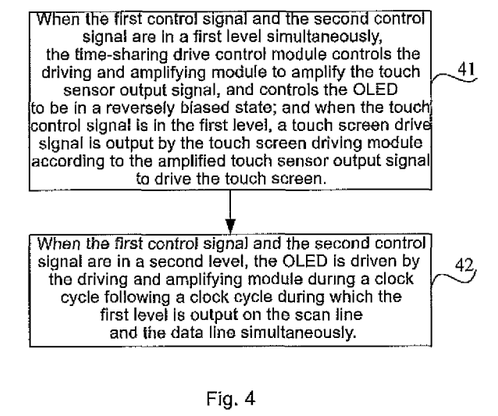
FIG. 4 is a flow chart of a drive method according to the first embodiment of the present invention.

As shown in FIG. 4, a drive method according to a first embodiment of the disclosure is adapted to the above drive circuit, the drive method includes:

a touch screen drive step 41, when the first control signal and the second control signal are in a first level simultaneously, the time-sharing drive control module controls the driving and amplifying module to amplify the touch sensor output signal, and controls the OLED to be in a reversely biased state; and when the touch control signal is in the first level, a touch screen drive signal is output by the touch screen driving module according to the amplified touch sensor output signal to drive the touch screen, and an OLED drive step 42, when the first control signal and the second control signal are in a second level, the OLED is driven by the driving and amplifying module during a clock cycle following a clock cycle during which the first level is output on the scan line and the data line simultaneously.

Figure 5:
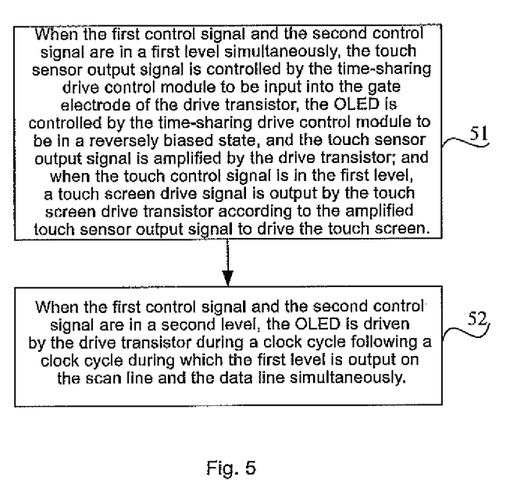
FIG. 5 is a flow chart of the drive method according to the second embodiment of the present invention.

As shown in FIG. 5, a drive method according to a second embodiment of the disclosure is adapted to the drive circuit according to the second embodiment of the disclosure, and the drive method includes:

a touch screen drive step 51, when the first control signal and the second control signal are in a first level simultaneously, the touch sensor output signal is controlled by the time-sharing drive control module to be input into the gate electrode of the drive transistor, the OLED is controlled by the time-sharing drive control module to be in a reversely biased state, and the touch sensor output signal is amplified by the drive transistor; and when the touch control signal is in the first level, a touch screen drive signal is output by the touch screen drive transistor according to the amplified touch sensor output signal to drive the touch screen; and an OLED drive step 52, when the first control signal and the second control signal are in a second level, the OLED is driven by the drive transistor during a clock cycle following a clock cycle during which the first level is output on the scan line and the data line simultaneously.

According to an embodiment, the touch screen drive step 51 includes:

a pre-charging step in which the first level is output at the first voltage terminal, on the data line and on the scan line, the first control signal and the second control signal are in the first level, the touch control signal is in the second level, the drive transistor and the input transistor are on, the touch screen drive transistor is off, the OLED is in the reversely biased state, the data signal output on the data line and the touch sensor output signal are input into the gate electrode of the drive transistor, and the storage capacitor is charged;

a discharging step in which the first level is output at the first voltage terminal and on the scan line, the first control signal and the second control signal are in the first level, the second level is output on the data line, the touch control signal is in the second level, the OLED drive transistor is lightly conducting, the input transistor is on, the touch screen drive transistor is off, the OLED is in the reversely biased state, the touch sensor output signal is input into the gate electrode of the drive transistor, and the storage capacitor is discharged;

a touch control step in which the first level is output at the first voltage terminal, the first control signal and the second control signal are in the first level, the second level is output on the scan line and the data line, the touch control signal is in the second level, the input transistor is off, the touch screen drive transistor is off, the OLED is in the reversely biased state, the level of the gate electrode of the drive transistor is pulled down by the touch sensor output signal via the time-sharing drive control module, and the touch sensor output signal is amplified by the drive transistor; and a touch screen drive step in which the first level is output at the first voltage terminal, the first control signal, the second control signal and the touch control signal are in the first level, the second level is output on the scan line and the data line, the input transistor is off, the OLED is in the reversely biased state, the touch screen drive transistor is on, and the touch screen drive signal is sent by the touch screen drive transistor according to the amplified touch sensor output signal, for driving the touch screen.

According to an embodiment, the OLED drive step 52 includes:

a pixel charging step in which the second level is output at the first voltage terminal and on the data line, the second control signal and the touch control signal are in the second level, the first control signal is in the first level, the first level is output on the scan line, the drain electrode of the drive transistor is in a open state, the gate electrode of the drive transistor is set to be in a low level, the OLED is in the reversely biased state, and the storage capacitor is charged;

a pixel discharging step in which the first level is output at the first voltage terminal, the second level is output on the data line, the second control signal and the touch control signal are in the second level, the first control signal is in the second level, the first level is output on the scan line, the drive transistor is on, and the storage capacitor is discharged;

a data inputting step in which the second level is output at the first voltage terminal, the first control signal and the second control signal are in the second level, the first level is output on the scan line and the data line, the touch control signal is in the second level, the drain electrode of the drive transistor is in a open state, the first level output on the data line is input into the storage capacitor, and the level of the source electrode of the drive transistor is pulled up; and an OLED light emitting step in which the first level is output at the first voltage terminal, the first control signal and the second control signal are in the second level, the second level is output on the scan line and the data line, the touch control signal is in the second level, and the drive transistor is on, for controlling the OLED to emit light.

It is further provided a pixel unit according to an embodiment of the disclosure, which includes an OLED and the above drive circuit, wherein the drive circuit is coupled to the anode of the OLED, and the cathode of the OLED is coupled to the second voltage terminal.

It is further provided a display device according to an embodiment of the disclosure, which includes the above pixel unit.

With the drive circuit and the drive method, the shift register, the pixel and the display device described in the disclosure, the driving and amplifying module 13 and the touch screen driving module 12 are controlled by the time-sharing drive control module 11 to drive the OLED and the touch screen in a time-sharing manner, the OLED and the touch screen are driven in the time-sharing manner by adjusting the time sequence of the signal without adding a drive signal, thus the OLED and the touch screen are driven with less elements, and at the same time, the crosstalk between the OLED drive signal and the touch screen drive signal is avoided efficiently.

It can be understood by those skilled in the art that all or some of the steps for implementing the above method embodiment can be achieved by hardware related to programs and instructions, which programs may be stored in a computer readable storage medium, which when executed perform the steps of the above method embodiment; and the above storage medium includes various medium that can store program and code, such as ROM, RAM, magnetic disk or optical disk.

The above are preferred embodiments of the disclosure, and it should be noted that several improvements and modifications can be made by those skilled in the art without deviating from the principle of the disclosure, which improvements and modifications should also be seemed as fall within the scope of protection of the disclosure.

What is claimed is:

1. A drive circuit for driving an OLED and a touch screen in an embedded OLED touch screen in a time-sharing manner, comprising a driving and amplifying module, a touch screen driving module and a time-sharing drive control module, wherein
the time-sharing drive control module is coupled respectively to a touch sensor signal output terminal, the driving and amplifying module, a first control signal output terminal, a second control signal output terminal and a first voltage terminal, and is configured to send a time-sharing drive control signal according to a first control signal and a second control signal;
the touch screen driving module is coupled respectively to the driving and amplifying module and a touch control signal output terminal, and is coupled to the touch screen via a touch screen drive signal output terminal; and
the driving and amplifying module is coupled respectively to the OLED, a second voltage terminal, a data line and a scan line, and is configured to drive the OLED during an OLED drive phase according to the time-sharing drive control signal, amplify a touch sensor output signal during a touch screen drive phase, and control the touch screen driving module to drive the touch screen according to a touch control signal and the amplified touch sensor output signal.

2. The drive circuit according to claim 1, wherein the driving and amplifying module comprises a drive transistor, an input transistor and a storage capacitor, wherein
the drive transistor has a gate electrode coupled to the touch sensor signal output terminal via the time-sharing drive control module, a first electrode coupled respectively to the first voltage terminal and the touch screen driving module, and a second electrode coupled respectively to the second voltage terminal and an anode of the OLED via the time-sharing drive control module;
the input transistor has a gate electrode coupled to the scan line, a first electrode coupled to the data line, and a second electrode coupled to the gate electrode of the drive transistor; and
the storage capacitor has a first terminal coupled to the gate electrode of the drive transistor and a second terminal coupled to the second electrode of the drive transistor.

3. The drive circuit according to claim 2, wherein the time-sharing drive control module comprises a first control transistor and a second control transistor, wherein
the first control transistor has a gate electrode coupled to the first control signal output terminal, a first electrode coupled to the second electrode of the drive transistor, and a second electrode coupled to the second voltage terminal; and
the second control transistor has a gate electrode coupled to the second control signal output terminal, a first electrode coupled to the gate electrode of the drive transistor, and a second electrode coupled to the touch sensor signal output terminal.

4. The drive circuit according to claim 3, wherein the touch screen driving module comprises a touch screen drive transistor, the touch screen drive transistor has a gate electrode coupled to the touch control signal output terminal, a first electrode coupled to the first voltage terminal and a second electrode which is the touch screen drive signal output terminal.

5. A drive method, comprising a touch screen drive step and an OLED drive step, wherein,
in the touch screen drive step, when the first control signal and the second control signal are in a first level simultaneously, the touch sensor output signal is controlled by the time-sharing drive control module to be input into the gate electrode of the drive transistor, the OLED is controlled by the time-sharing drive control module to be in a reversely biased state, and the touch sensor output signal is amplified by the drive transistor; and when the touch control signal is in the first level, a touch screen drive signal is output by the touch screen drive transistor according to the amplified touch sensor output signal to drive the touch screen; and
in the OLED drive step, when the first control signal and the second control signal are in a second level, the OLED is driven by the drive transistor during a clock cycle following a clock cycle during which the first level is output on the scan line and the data line simultaneously.

6. The drive method according to claim 5, wherein the touch screen drive step comprises a pre-charging step, a discharging step, a touch control step and a touch screen drive step, wherein,
in the pre-charging step, the first level is output at the first voltage terminal, on the data line and on the scan line, the first control signal and the second control signal are in the first level, the touch control signal is in the second level, the drive transistor and the input transistor are on, the touch screen drive transistor is off, the OLED is in the reversely biased state, the data signal output on the data line and the touch sensor output signal are input into the gate electrode of the drive transistor, and the storage capacitor is charged;
in the discharging step, the first level is output at the first voltage terminal and on the scan line, the first control signal and the second control signal are in the first level, the second level is output on the data line, the touch control signal is in the second level, the OLED drive transistor is lightly conducting, the input transistor is on, the touch screen drive transistor is off, the OLED is in the reversely biased state, the touch sensor output signal is input into the gate electrode of the drive transistor, and the storage capacitor is discharged;
in the touch control step, the first level is output at the first voltage terminal, the first control signal and the second control signal are in the first level, the second level is output on the scan line and the data line, the touch control signal is in the second level, the input transistor is off, the touch screen drive transistor is off, the OLED is in the reversely biased state, the level of the gate electrode of the drive transistor is pulled down by the touch sensor output signal via the time-sharing drive control module, and the touch sensor output signal is amplified by the drive transistor; and in the touch screen drive step, the first level is output at the first voltage terminal, the first control signal, the second control signal and the touch control signal are in the first level, the second level is output on the scan line and the data line, the input transistor is off, the OLED is in the reversely biased state, the touch screen drive transistor is on, and the touch screen drive signal is sent by the touch screen drive transistor according to the amplified touch sensor output signal to drive the touch screen.

7. The drive method according to claim 5, wherein the OLED drive step comprises a pixel charging step, a pixel discharging step, a data inputting step and an OLED light emitting step, wherein, in the pixel charging step, the second level is output at the first voltage terminal and on the data line, the second control signal and the touch control signal are in the second level, the first control signal is in the first level, the first level is output on the scan line, the drain electrode of the drive transistor is in a open state, the gate electrode of the drive transistor is set to be in a low level, the OLED is in the reversely biased state, and the storage capacitor is charged;

in the pixel discharging step, the first level is output at the first voltage terminal, the second level is output on the data line, the second control signal and the touch control signal are in the second level, the first control signal is in the second level, the first level is output on the scan line, the drive transistor is on, and the storage capacitor is discharged;

in the data inputting step, the second level is output at the first voltage terminal, the first control signal and the second control signal are in the second level, the first level is output on the scan line and the data line, the touch control signal is in the second level, the drain electrode of the drive transistor is in a open state, the first level output on the data line is input into the storage capacitor, and the level of the source electrode of the drive transistor is pulled up; and in the OLED light emitting step, the first level is output at the first voltage terminal, the first control signal and the second control signal are in the second level, the second level is output on the scan line and the data line, the touch control signal is in the second level, and the drive transistor is on, for controlling the OLED to emit light.

8. The drive method according to claim 6, wherein the OLED drive step comprises a pixel charging step, a pixel discharging step, a data inputting step and an OLED light emitting step, wherein, in the pixel charging step, the second level is output at the first voltage terminal and on the data line, the second control signal and the touch control signal are in the second level, the first control signal is in the first level, the first level is output on the scan line, the drain electrode of the drive transistor is in a open state, the gate electrode of the drive transistor is set to be in a low level, the OLED is in the reversely biased state, and the storage capacitor is charged;

in the pixel discharging step, the first level is output at the first voltage terminal, the second level is output on the data line, the second control signal and the touch control signal are in the second level, the first control signal is in the second level, the first level is output on the scan line, the drive transistor is on, and the storage capacitor is discharged;

in the data inputting step, the second level is output at the first voltage terminal, the first control signal and the second control signal are in the second level, the first level is output on the scan line and the data line, the touch control signal is in the second level, the drain electrode of the drive transistor is in a open state, the first level output on the data line is input into the storage capacitor, and the level of the source electrode of the drive transistor is pulled up; and in the OLED light emitting step, the first level is output at the first voltage terminal, the first control signal and the second control signal are in the second level, the second level is output on the scan line and the data line, the touch control signal is in the second level, and the drive transistor is on, for controlling the OLED to emit light.

9. A shift register, comprising N stages of drive circuits according to claim 1, wherein the touch screen drive signal output terminal of the $(M-1)^{th}$ stage of drive circuit is coupled to the touch control signal output terminal of the $M^{th}$ stage of drive circuit, where M is a positive integer greater than 2 and less than or equal to N, and N is a positive integer greater than 2.

* * * * *